(12) United States Patent
Henley

(10) Patent No.: US 7,399,680 B2
(45) Date of Patent: Jul. 15, 2008

(54) METHOD AND STRUCTURE FOR IMPLANTING BONDED SUBSTRATES FOR ELECTRICAL CONDUCTIVITY

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 270 days.

(21) Appl. No.: 11/292,395

(22) Filed: Nov. 30, 2005

(65) Prior Publication Data

US 2006/0138583 A1    Jun. 29, 2006

Related U.S. Application Data

(63) Continuation-in-part of application No. 11/280,016, filed on Nov. 15, 2005.

(60) Provisional application No. 60/630,800, filed on Nov. 24, 2004.

(51) Int. Cl.
*H01L 21/30* (2006.01)
*H01L 21/46* (2006.01)

(52) U.S. Cl. ............... 438/455; 438/459; 257/E21.122

(58) Field of Classification Search ............... 438/406, 438/455, 456, 459, 480, 514, 530; 257/E21.122
See application file for complete search history.

(56) References Cited

U.S. PATENT DOCUMENTS

2007/0231850 A1* 10/2007 Geoffrey et al. ............... 435/29

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

* cited by examiner

*Primary Examiner*—Thien F Tran
(74) *Attorney, Agent, or Firm*—Townsend and Townsend and Crew LLP

(57) ABSTRACT

A partially completed multi-layered substrate, e.g., silicon on silicon. The substrate has a thickness of material from a first substrate. The thickness of material comprises a first face region. The substrate has a second substrate having a second face region. Preferably, the first face region of the thickness of material is joined to the second face region of the second substrate. The substrate has an interface region formed between the first face region of the thickness of material and the second face region of the second substrate. A plurality of particles are implanted within a portion of the thickness of the material and a portion of the interface region to electrically couple a portion of the thickness of material to a portion of the second substrate.

26 Claims, 5 Drawing Sheets

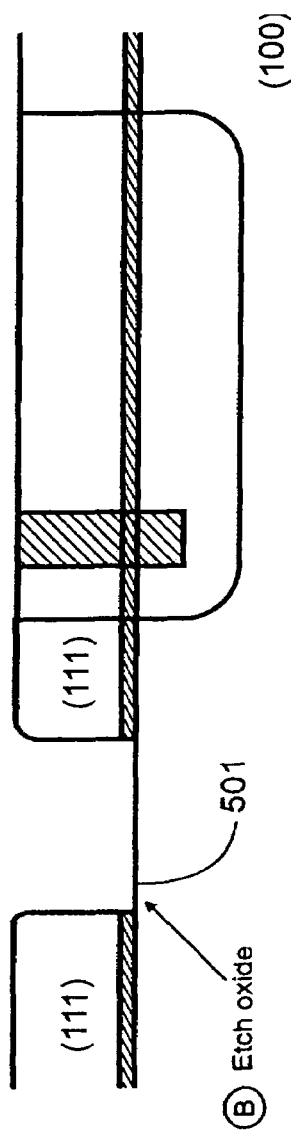
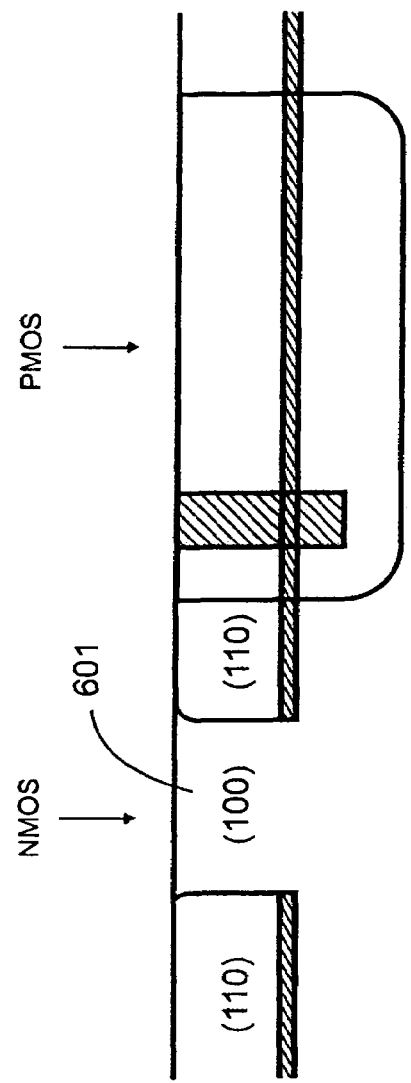

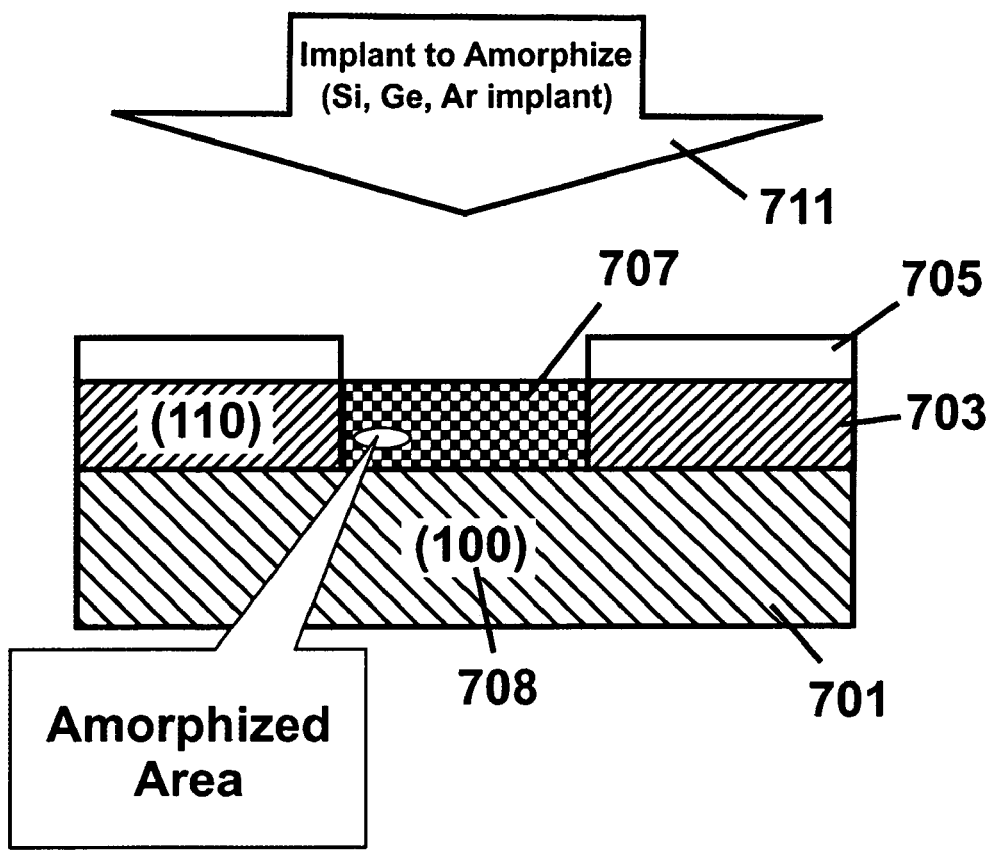
FIGURE 7. Implant areas to define new orientation

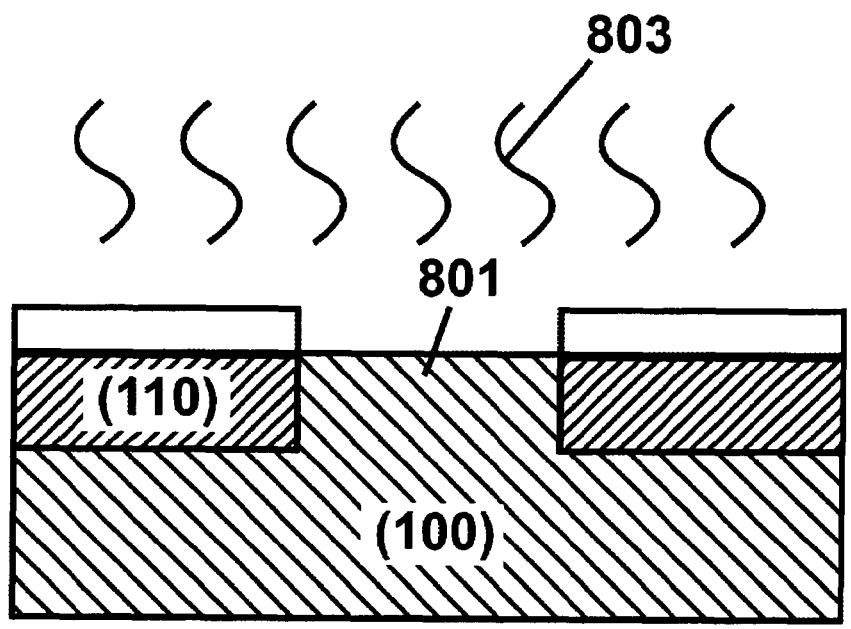
FIGURE 8. Heat treatment (furnace, RTA) to re-grow crystal. It will re-grow (100) in this case

METHOD AND STRUCTURE FOR IMPLANTING BONDED SUBSTRATES FOR ELECTRICAL CONDUCTIVITY

CROSS-REFERENCE TO RELATED APPLICATIONS

This application is continuation-in-part of, and claims priority to, U.S. Nonprovisional patent application Ser. No. 11/280,016 filed on Nov. 15, 2005, which claims priority to U.S. Provisional Patent Application 60/630,800 filed Nov. 24, 2004, each of which is commonly assigned, and each of which is hereby incorporated by reference for all purposes.

BACKGROUND OF THE INVENTION

The present invention relates to the manufacture of substrates. More particularly, the invention provides a technique including a method and device for forming a conductive region between bonded substrates using an implanting technique for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (i.e., monocrystalline) silicon, commonly termed a "bulk" silicon wafer. Devices on such a "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately. Bulk silicon wafers, which are greater than 200 millimeters, are not free from defects and can reduce overall devices yields and the like.

An approach to achieving very-large scale integration ("VLSI") or ultra-large scale integration ("ULSI") uses epitaxial silicon wafers, which are commonly known as "epiwafers." Epi-wafers often have a layer of high quality single crystalline silicon material defined overlying a face of a bulk substrate. The high quality silicon layer provides a good site for fabricating devices, often with higher yields, than conventional bulk silicon wafer materials. The high quality silicon material is often deposited by way of epitaxial silicon process reactors made by companies called Applied Materials, Inc. of Santa Clara, Calif. or ASM of Phoenix, Ariz.

Epitaxial wafers offer other advantages over bulk silicon technologies as well. For example, epitaxial wafers have almost perfect crystalline characteristics, which enhance device speed, functionality, and reliability. Additionally, the epitaxial wafers often provide higher device yields, than conventional bulk wafers. Many problems, however, than have already been solved regarding fabricating devices on bulk silicon wafers remain to be solved for fabricating devices on epitaxial silicon wafers. Epitaxial silicon wafers are made by way of epitaxial reactors, which are often expensive to purchase and difficult to maintain. The process of forming epitaxial silicon is also slow and time consuming. Accordingly, resulting epitaxial silicon wafers can often be expensive and cannot be used for the manufacture of many commercial or commodity devices such as dynamic random access memory devices (i.e., DRAMs), for example.

Another approach to achieving large scale integration often uses bonding substrates made of silicon bearing materials. Such bonding wafers are often made using layer transfer techniques, such as those described in U.S. Pat. No. 6,013,563, ("Henley, et al.") commonly assigned to Silicon Genesis Corporation of San Jose, Calif. and hereby incorporated by reference for all purposes. Henley, et al. relates to a controlled cleaving process for manufacturing multilayered substrates. Such bonded substrates include silicon on insulator, commonly called SOI, and others. Although there has been much improvement in manufacturing substrate, there are still certain limitations that should be overcome. These limitations have been described throughout the present specification and more particularly below.

From the above, it is seen that an improved technique for manufacturing a multi-layered wafer is highly desirable.

BRIEF SUMMARY OF THE INVENTION

According to the present invention, techniques for the manufacture of substrates are provided. More particularly, the invention provides a technique including a method and device for forming a conductive region between bonded substrates using an implanting technique for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

In a specific embodiment, the present invention provides a process for forming multi-layered substrates, e.g., silicon on silicon. The process includes providing a first substrate, which has a thickness of material to be removed. In a specific embodiment, the thickness of material can be about 8000 Angstroms or greater. The thickness of material to be removed includes a first face region. The process includes joining the first face region of the first substrate to a second face region of a second substrate to form an interface region between the first face region of the first substrate and the second face region of the second substrate. Preferably, the joining occurs using a bonding process with an insulating or like layer according to a specific embodiment. Alternatively, the interface region can be free of an insulating material, but have a resistive characteristic according to a specific embodiment. The process includes removing the thickness of material from the first substrate while maintaining attachment of the first face region of the first substrate to the second face region of the second substrate. Preferably, the thickness of material is removed using a layer transfer process or like process. In a preferred embodiment, the particles are conductive or can also have other characteristics that facilitates electrical contact or coupling between the first face region and the second face region according to a specific embodiment.

In a specific embodiment, the method forms a masking layer overlying a surface region of the thickness of material to form an exposed region of a portion of the thickness of material. The method implants particles into the exposed region and through a portion of the interface region to form a region of the particles within the vicinity of the portion the interface region to couple the portion of the thickness of material to the second substrate. In a specific embodiment, the method causes formation of an implanted region including at least the exposed region and the portion of the thickness of material. The method also subjects at least the implanted region to at least a thermal treatment process to cause crystallization of the implanted region.

In an alternative specific embodiment, the present invention provides a partially completed multi-layered substrate, e.g., silicon on silicon. The substrate has a thickness of material from a first substrate. The thickness of material comprises a first face region. The substrate has a second substrate having a second face region. Preferably, the first face region of the thickness of material is joined to the second face region of the second substrate. The substrate has an interface region formed between the first face region of the thickness of material and the second face region of the second substrate. A plurality of particles are implanted within a portion of the thickness of the material and a portion of the interface region to electrically couple a portion of the thickness of material to a portion of the second substrate.

Many benefits are achieved by way of the present invention over conventional techniques. For example, the present technique provides an easy to use process that relies upon conventional technology. In some embodiments, the method provides higher device yields. Additionally, the method provides a process that is compatible with conventional process technology without substantial modifications to conventional equipment and processes. Preferably, the invention provides for an improved process integration for advanced integrated circuit devices. Additionally, the process provides a multilayered substrate structure that includes electrical coupling between the first and second substrates. In a specific embodiment, the present method and structure can also reduce bond voids at the interface region between the two substrate members. The reduction of bond voids can occur by attaching one or more implanted particles to H/H2 atoms, which have been derived from a prior hydrogen treatment process as an example, that may be present at the interface region and may have contributed to formation of such voids at the interface region. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 4 through 6 are simplified diagrams illustrating an alternative method for forming a multilayer substrate structure according to an alternative embodiment of the present invention; and FIGS. 7 and 8 are simplified diagrams illustrating an alternative method for forming a multilayer substrate structure according to embodiments of the present invention.

DETAILED DESCRIPTION OF THE INVENTION

According to the present invention, techniques for the manufacture of substrates are provided. More particularly, the invention provides a technique including a method and device for forming a conductive region between bonded substrates using an implanting technique for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

A method for manufacturing bonded substrates according to an embodiment of the present invention may be outlined as follows:

1. Provide a first substrate, which has a thickness of material to be removed;
2. Join a first face region of the first substrate to a second face region of a second substrate;
3. Form an interface region between the first face region of the first substrate and the second face region of the second substrate;
4. Remove the thickness of material from the first substrate while maintaining attachment of the first face region of the first substrate to the second face region of the second substrate;
5. Implant particles through the interface region to form a region of the particles within the vicinity of the interface region to electrically couple the thickness of material to the second substrate;
6. Treat the bonded substrate structure;
7. Form integrated circuit device structures on the thickness of material; and
8. Perform other steps, as desired.

The above sequence of steps provides a method for manufacturing substrates according to an embodiment of the present invention. As shown, the method uses a combination of steps including a way of forming a conductive layer between bonded substrate regions using an implanting technique. Of course, other alternatives can also be provided where steps are added, one or more steps are removed, or one or more steps are provided in a different sequence without departing from the scope of the claims herein. Further details of the present method can be found throughout the present specification and more particularly below.

Figure 1:
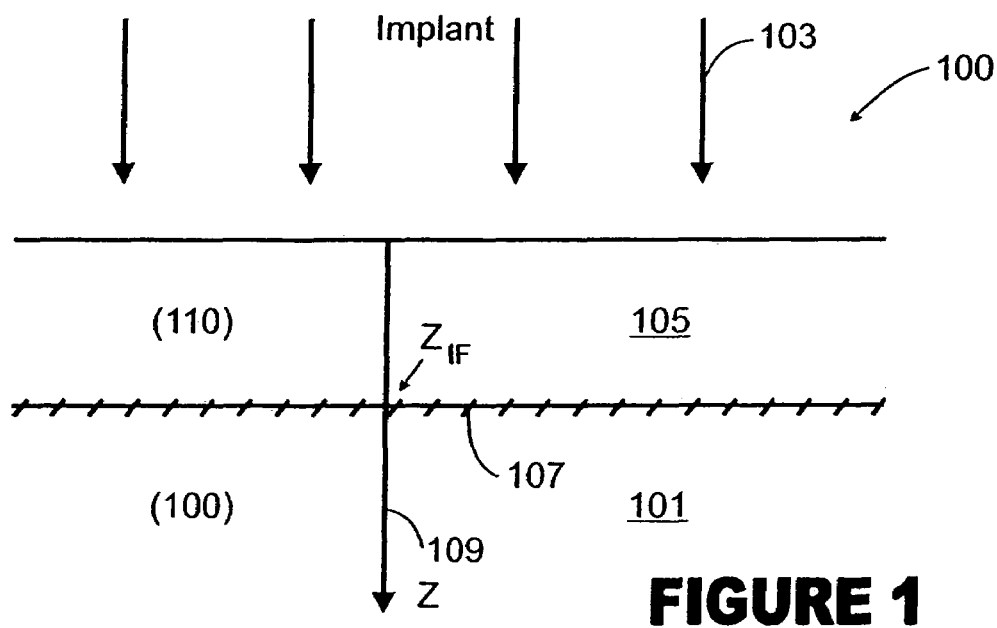
FIG. 1 is a simplified diagram illustrating a method for forming a multilayered substrate structure according to an embodiment of the present invention.

FIG. 1 is a simplified diagram 100 illustrating a method for forming a multilayered substrate structure according to an embodiment of the present invention. This diagram is merely an example, which should not unduly limit the scope of the claims herein. One of ordinary skill in the art would recognize many variations, modifications, and alternatives. In a specific embodiment, the present invention provides a process for forming multi-layered substrates, e.g., silicon on silicon, germanium on silicon, Group III/V materials on substrate structures. The process includes providing a first substrate, which has a thickness of material 105 to be removed. The thickness of material to be removed includes a first face region. In a specific embodiment, the thickness of material may be silicon, germanium, Group III/V materials, and others. Depending upon the embodiment, a silicon substrate structure has a major crystallographic plane in the {100} plane, {110} plane, or {111} plane.

The process includes joining the first face region of the first substrate to a second face region of a second substrate 101. Depending upon the embodiment, the second substrate can be made of a variety of materials such as those of the first substrate, as well as others. In a specific embodiment, the second substrate is a silicon material that has a major crystallographic plane in the {100} plane, {110} plane, or {111} plane. Preferably, joining occurs using a bonding process that may include a cleaning process and/or plasma activation process to facilitate bonding at lower temperatures. The cleaning process includes plasma activated cleaning and/or other processing techniques. An example of such a technique can be found in U.S. Pat. No. 6,645,828, which is commonly assigned to Silicon Genesis Corporation, and hereby incorporated by reference herein. In a preferred embodiment, the joining process forms an interface region 107 between the first face region of the first substrate and the second face region of the second substrate. In a specific embodiment, the interface region can include an insulating material such as an oxide or silicon dioxide according to a specific embodiment. Other types of interfaces such as glue layers, metal layers, and the like can also be used depending upon the embodiment. Using an oxide insulating layer and silicon substrates, silicon on insulator structures can be formed according to a specific embodiment. The process includes removing the thickness of material from the first substrate while maintaining attachment of the first face region of the first substrate to the second face region of the second substrate. In a preferred embodiment, the method for forming the bonded substrate structure is what is know as a "layer transfer" process, such as those described in Henley, et al., above, others commonly called Smart-Cut™ by Soitec, SA of France, any combination of these, and the like. Of course, one of ordinary skill in the art would recognize other variations, modifications, and alternatives.

In a specific embodiment, the process implants particles 103 through the interface region to form a region of the particles within the vicinity of the interface region. In a preferred embodiment, implanting can occur through the thickness of material, through the interface region, and through a portion of the second substrate. In a specific embodiment, the particles can be conductive and/or exhibit other characteristics to facilitate electrical coupling between the thickness of material to the second substrate. Preferably, the particles can include dopant particles selected from boron, arsenic, phosphorus, and silicon according to a specific embodiment. In a specific embodiment, the particles can also be silicon (e.g., silicon ions), germanium (e.g., germanium ions), other semiconductors, and/or metals, depending upon the embodiment. In a specific embodiment, the particles can include a concentration of about $10^{18}$ particles/cm$^3$ and greater, or less depending upon the application. Certain details of the electrical coupling can be found according to the figure below.

Figure 2:
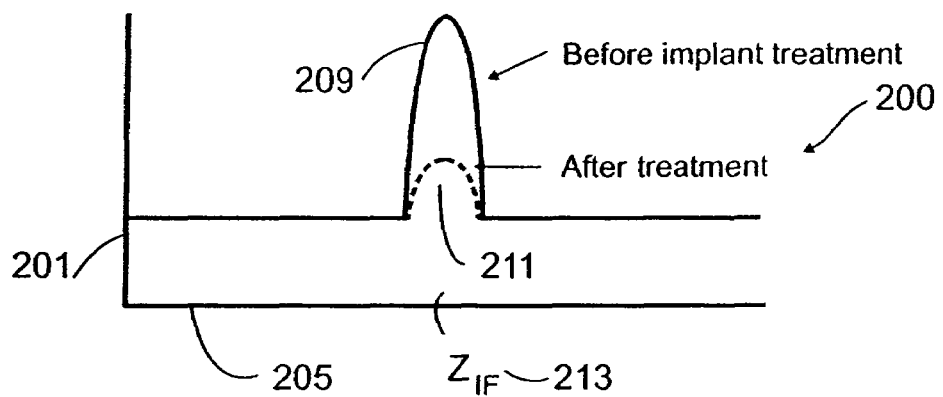
FIG. 2 is a simplified plot of resistance against implant depth for a multilayered substrate according to an embodiment of the present invention.

FIG. 2 is a simplified plot 200 of resistance against implant depth for a multilayered substrate according to an embodiment of the present invention. This diagram is merely an example, which should not unduly limit the scope of the claims herein. One of ordinary skill in the art would recognize many variations, modifications, and alternatives. As shown, the vertical axis 201 represents resistivity 201, which is plotted against implant depth on the horizontal axis 205. Referring to FIG. 1, depth is measured in a z-direction 109 from a surface region of the bonded substrate structure toward a center region of the bonded substrate, which is normal to the surface regions, according to a specific embodiment. As shown, the resistivity includes a peak 209 for a condition before implanting and a reduced peak 211 for a condition after implanting according to a specific embodiment. The reduce peak or substantially continuous conductivity through the interface region facilitates electrical coupling and/or conductivity between the thickness of material of the first substrate and a portion of the second substrate according to a specific embodiment. Other embodiments of the present invention can be found throughout the present specification and more particularly below.

In a specific embodiment, the process performs a treatment of the bonded substrate structure. The treatment can include thermal annealing to remove any imperfections in the implanted interface region according to a specific embodiment. The thermal treatment can be provided by a furnace, rapid thermal anneal, or any combination of these. The process forms integrated circuit elements and devices onto the thickness of materials according to preferred embodiments. Of course, one of ordinary skill in the art would recognize many variations, modifications, and alternatives.

In an alternative specific embodiment, the present invention provides a process for forming multi-layered substrates, e.g., silicon on silicon, which is outlined below.

1. Provide a first substrate, which has a thickness of material to be removed;

2. Join a first face region of the first substrate to a second face region of a second substrate;

3. Form an interface region between the first face region of the first substrate and the second face region of the second substrate;

4. Remove the thickness of material from the first substrate while maintaining attachment of the first face region of the first substrate to the second face region of the second substrate;

5. Form a plurality of openings in a spatial manner through the interface region between the first face region of the first substrate and the second face region of the second substrate;

6. Fill one or more of the openings with a conductive material to electrically couple the thickness of material to the second substrate; and 7. Optionally, implant particles into the interface region to also facilitate electrical coupling between the thickness of material and the second substrate;

8. Treat bonded substrate structure;

9. Form integrated circuit devices on the thickness of material; and

10. Perform other steps, as desired.

The above sequence of steps provides a method for manufacturing substrates according to an embodiment of the present invention. As shown, the method uses a combination of steps including a way of forming a conductive layer between bonded substrate regions using conductive plug regions and optionally an implanting technique. Of course, other alternatives can also be provided where steps are added, one or more steps are removed, or one or more steps are provided in a different sequence without departing from the scope of the claims herein. Further details of the present method can be found throughout the present specification and more particularly below.

Figure 3:
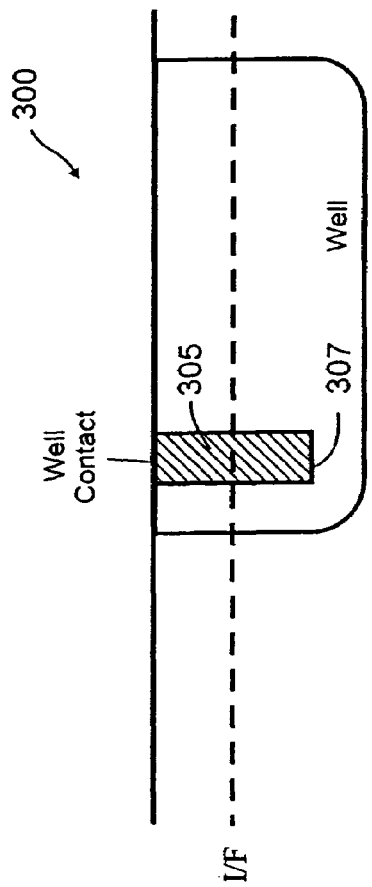
FIG. 3 is a simplified diagram of a multilayered substrate structure according to an alternative embodiment of the present invention.

FIG. 3 is a simplified diagram of a multilayered substrate structure 300 according to an alternative embodiment of the present invention. This diagram is merely an example, which should not unduly limit the scope of the claims herein. One of ordinary skill in the art would recognize many variations, modifications, and alternatives. In an alternative specific embodiment, the present invention provides a process for forming multi-layered substrates, e.g., silicon on silicon, germanium on silicon, Group III/V materials on substrate structures. The process includes providing a first substrate, which has a thickness of material to be removed. The thickness of material to be removed includes a first face region. In a specific embodiment, the thickness of material may be silicon, germanium, Group III/V materials, and others. Depending upon the embodiment, a silicon substrate structure has a major crystallographic plane in the {100} plane, {110} plane, or {111} plane.

The process includes joining the first face region of the first substrate to a second face region of a second substrate according to a specific embodiment. Depending upon the embodiment, the second substrate can be made of a variety of materials such as those of the first substrate, as well as others. In a specific embodiment, the second substrate is a silicon material that has a major crystallographic plane in the {100} plane, {110} plane, or {111} plane. Preferably, joining occurs using a bonding process that may include a cleaning process and/or plasma activation process to facilitate bonding at lower temperatures. The cleaning process includes plasma activated cleaning and/or other processing techniques. An example of such a technique can be found in U.S. Pat. No. 6,645,828, which is commonly assigned to Silicon Genesis Corporation, and hereby incorporated by reference herein. In a preferred embodiment, the joining process forms an interface region between the first face region of the first substrate and the second face region of the second substrate. The process includes removing the thickness of material from the first substrate while maintaining attachment of the first face region of the first substrate to the second face region of the second substrate. In a preferred embodiment, the method for forming the bonded substrate structure is what is know as a "layer transfer" process, such as those described in Henley, et al., others commonly called Smart-Cut™ by Soitec, SA of France, and the like. Of course, one of ordinary skill in the art would recognize other variations, modifications, and alternatives.

In a preferred embodiment, the process forms a plurality of openings 307 in a spatial manner through the interface region between the first face region of the first substrate and the second face region of the second substrate. The process also fills one or more of the openings with a conductive material 305 to electrically couple the thickness of material to the second substrate. The conductive material can include a metal, a doped semiconductor material, any combination of these, and others, including multilayered structures and the like. The conductive structures can be similar to via structures, which are used in conventional devices as interconnects or like. As shown, the conductive material interconnects the thickness of material to the second substrate. The conductive material can be formed within a well structure, as also shown. The conductive material fills an entirety of the opening to electrically and to physically connect the two substrate structures together. Of course, one of ordinary skill in the art would recognize many variations, modifications, and alternatives.

In a specific embodiment, the process performs a treatment of the bonded substrate structure. The treatment can include thermal annealing to remove any imperfections in the implanted interface region according to a specific embodiment. The thermal treatment can be provided by a furnace, rapid thermal anneal, or any combination of these. The process forms integrated circuit elements and devices onto the thickness of materials according to preferred embodiments. Of course, one of ordinary skill in the art would recognize many variations, modifications, and alternatives.

In an alternative specific embodiment, the present invention provides an alternative process for forming multi-layered substrates, e.g., silicon on silicon, which is outlined below.

1. Provide a first substrate, which has a thickness of material to be removed;
2. Join a first face region of the first substrate to a second face region of a second substrate;
3. Form an interface region between the first face region of the first substrate and the second face region of the second substrate;
4. Remove the thickness of material from the first substrate while maintaining attachment of the first face region of the first substrate to the second face region of the second substrate;
5. Form a plurality of openings in a spatial manner through the interface region between the first face region of the first substrate and the second face region of the second substrate;
6. Fill one or more of the openings with a conductive material to electrically couple the thickness of material to the second substrate;
7. Optionally, implant particles into the interface region to also facilitate electrical coupling between the thickness of material and the second substrate;
8. Remove a portion of the thickness of material using a portion of the interface region as a stop layer;
9. Selectively remove the portion of the stop layer within the vicinity of the portion of the interface region to expose an underlying portion of the second substrate; and
10. Form an epitaxial layer overlying the exposed portion of the second substrate;
11. Form integrated circuit devices on the thickness of material and epitaxial layer; and
12. Perform other steps, as desired.

The above sequence of steps provides a method for manufacturing substrates according to an embodiment of the present invention. As shown, the method uses a combination of steps including a way of forming a conductive layer between bonded substrate regions using conductive plug regions, optionally an implanting technique, and forming an epitaxial layer overlying a portion of the second substrate. Of course, other alternatives can also be provided where steps are added, one or more steps are removed, or one or more steps are provided in a different sequence without departing from the scope of the claims herein. Further details of the present method can be found throughout the present specification and more particularly below.

Figure 4:
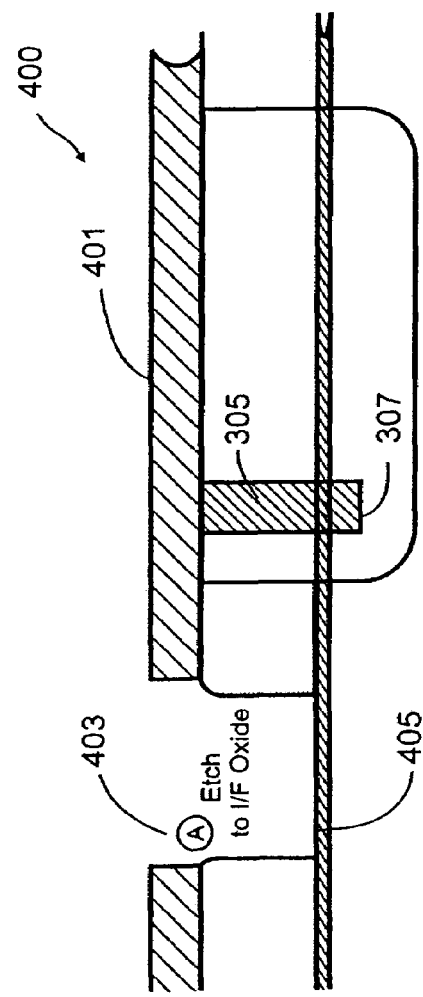

FIGS. 4 through 6 are simplified diagrams 400 illustrating an alternative method for forming a multilayered substrate structure according to an alternative embodiment of the present invention. These diagrams are merely examples, which should not unduly limit the scope of the claims herein. One of ordinary skill in the art would recognize many variations, modifications, and alternatives. In an alternative specific embodiment, the present invention provides an alternative process for forming multi-layered substrates, e.g., silicon on silicon, germanium on silicon, Group III/V materials on substrate structures, silicon germanium on silicon or other materials, silicon carbide on insulator, GaN multilayered structures, combination of these, and others. The process includes providing a first substrate, which has a thickness of material to be removed. The thickness of material to be removed includes a first face region. In a specific embodiment, the thickness of material may be silicon, germanium, Group III/V materials, and others. Depending upon the embodiment, a silicon substrate structure has a major crystallographic plane in the {100} plane, {110} plane, or {111} plane.

The process includes joining the first face region of the first substrate to a second face region of a second substrate according to a specific embodiment. Depending upon the embodiment, the second substrate can be made of a variety of materials such as those of the first substrate, as well as others. In a specific embodiment, the second substrate is a silicon material that has a major crystallographic plane in the {100} plane, {110} plane, or {111} plane. Preferably, joining occurs using a bonding process that may include a cleaning process and/or plasma activation process to facilitate bonding at lower temperatures. The cleaning process includes plasma activated cleaning and/or other processing techniques. An example of such a technique can be found in U.S. Pat. No. 6,645,828, which is commonly assigned to Silicon Genesis Corporation, and hereby incorporated by reference herein. In a preferred embodiment, the joining process forms an interface region between the first face region of the first substrate and the second face region of the second substrate. The process includes removing the thickness of material from the first substrate while maintaining attachment of the first face region of the first substrate to the second face region of the second substrate. In a preferred embodiment, the method for forming the bonded substrate structure is what is know as a "layer transfer" process, such as those described in Henley, et al., others commonly called Smart-Cut™ by Soitec, SA of France, and the like. Of course, one of ordinary skill in the art would recognize other variations, modifications, and alternatives.

In a preferred embodiment, the process forms a plurality of openings 307 in a spatial manner through the interface region between the first face region of the first substrate and the second face region of the second substrate. The process also fills one or more of the openings with a conductive material 305 to electrically couple the thickness of material to the second substrate. The conductive material can include a metal, a doped semiconductor material, any combination of these, and others, including multilayered structures and the like. The conductive structures can be similar to via structures, which are used in conventional devices as interconnects or like. As shown, the conductive material interconnects the thickness of material to the second substrate. The conductive material can be formed within a well structure, as also shown. The conductive material fills an entirety of the opening to electrically and to physically connect the two substrate structures together. Of course, one of ordinary skill in the art would recognize many variations, modifications, and alternatives.

Referring to FIG. 4, the method forms a mask structure 401 overlying the thickness of material in the bonded substrate structure according to a specific embodiment. As shown, the thickness of material includes an exposed region 403. The exposed region can be silicon bearing material, which can be selectively etched using an etching species. The exposed region is a portion of the thickness of material according to a specific embodiment. The interface region 405, which is often insulating material (e.g., oxide), can be used as a stop layer according to a specific embodiment. As shown, a trench region has been formed within the thickness of material by removing the portion of the thickness of material according to a specific embodiment.

The method selectively removes the insulating layer, as illustrated in FIG. 5. The selective removal of the insulating layer exposes 501 a silicon bearing material, which is substantially free from any imperfections, etc. In a preferred embodiment, the selective removal occurs using a selective etchant including a wet etching species and the like. As merely an example, fluorine based chemistries such as hydrofluoric acid (HF), buffered hydrofluoric acid (BHF), buffered oxide etch (BOE), and others can be used, depending upon the application. The exposed portion of the second substrate is substantially free from any damage due to the selective removal process, which is often a wet etch or can be a selective dry etching process such as plasma etching and the like. Referring to FIG. 6, the method forms an epitaxial layer 601 overlying the exposed second substrate region. The epitaxial layer can be a different crystal orientation of silicon such as {100} as compared to the thickness of material {110}. The epitaxial layer can be formed using a doping process such as in-situ doping and others. In a specific embodiment, the epitaxial layer is a single crystal silicon structure. As shown, NMOS devices can be formed on the epitaxial layer, which is silicon, germanium, or other species, and PMOS devices can be formed on the thickness of material. Of course, one of ordinary skill in the art would recognize many variations, alternatives and modifications. Further details of methods and resulting structures according to embodiments of the present invention may be described below.

FIGS. 7 and 8 are simplified diagrams illustrating an alternative method for forming a multilayer substrate structure according to an embodiment of the present invention. These diagrams are merely examples and should not unduly limit the scope of the claims herein. One of ordinary skill in the art would recognize many variations, alternatives, and modifications. As an alternative way of forming an epitaxial layer, which has been described above, is illustrated by way of processes including implanting particles 711 to form an implanted region 707. In a specific embodiment, the particles are provided through an opening in masking layer 705. In a specific embodiment, the particles can include silicon, germanium, arsenic, any of the other species described herein, as well as others.

In a specific embodiment, the masking layer 705 can be a photolithographic layer and/or hard mask according to a specific embodiment. An example of a hard mask can be a silicon nitride layer and/or oxide layer according to a specific embodiment. As noted, the masking layer can also be a photolithographic layer, including single and multilayered structures, depending upon the specific embodiment. The masking layer is formed overlying the thickness of material 703, which has been cleaved and/or layer transferred according to a specific embodiment. The thickness of material is overlying a substrate material 701, which has been previously described. In a specific embodiment, the thickness of material can include single crystal silicon and other materials. Of course, there can be other variations, modifications, and alternatives.

In a specific embodiment, the implanted region 707 includes a portion of the thickness of material and a region within a vicinity of an interface 708 between the thickness of material and underlying substrate material. In a specific embodiment, the implanted region becomes an amorphized region and/or can take on other characteristics. That is, the implanted region has amorphous characteristics, which may also include other characteristics, but is generally amorphous according to a specific embodiment. As shown in FIG. 7, the implant areas define a new orientation.

Referring to FIG. 8, the method includes a thermal treatment process 803 according to a specific embodiment. The thermal treatment process can be provided by a suitable technique such as a furnace process, a rapid thermal anneal process, and/or other processes. Of course, there can be other variations, modifications, and alternatives.

In one specific embodiment, the thermal treatment process can be used to crystallize and/or re-grow crystal in the implanted region. As shown, the crystallized material can be of the same type as the second substrate, which has a {100} orientation according to one particular embodiment. The thermal annealing can occur at a temperature ranging from about 600° C. to about 1250° C. for silicon materials, according to a specific embodiment.

The annealing can take place as a single anneal or in multiple cycles, under the same or different conditions. For example, one anneal cycle could be used for recrystallization, and another anneal cycle could be used to remove defects. In accordance with one embodiment of the present invention, a recrystallization anneal cycle could be performed at 650-800° C., and an anneal cycle to remove defects could be performed at 1000-1250° C.

The annealing can be maintained in a vacuum and/or atmospheric pressure according to a specific embodiment. Annealing can also be maintained in a vacuum environment, an inert environment (for example including Argon and/or Nitrogen), a Hydrogen containing environment, a forming gas (for example including Hydrogen/Argon or other similar mixtures), and in an environment including an etching atmosphere such as H & HCl. The anneal can be initiated before or after the removal of the photolithographic layer or hard mask. The anneal could also be performed in an oxidizing ambient in order to grow an oxide onto the exposed surfaces. The anneal could be performed in combination with processes described in U.S. Pat. No. 6,103,599, which is incorporated by reference herein for all purposes. The annealing heat treatment can be performed done when the surface has been covered with a deposited oxide or other passivation layer. Of course, there can be other variations, modifications, and alternatives.

In a specific embodiment, the process performs a treatment of the bonded substrate structure. The treatment can include thermal annealing to remove any imperfections in the implanted interface region according to a specific embodiment. The thermal treatment can be provided by a furnace, rapid thermal anneal, or any combination of these. The process forms integrated circuit elements and devices onto the thickness of materials according to preferred embodiments. Of course, one of ordinary skill in the art would recognize many variations, modifications, and alternatives.

The above sequence of steps provides a method for manufacturing substrates according to an embodiment of the present invention. As shown, the method uses a combination of steps including a way of forming a conductive layer between bonded substrate regions using conductive plug regions, optionally an implanting technique, and forming an epitaxial layer overlying a portion of the second substrate. Of course, other alternatives can also be provided where steps are added, one or more steps are removed, or one or more steps are provided in a different sequence without departing from the scope of the claims herein.

Although the above has been shown in terms of a specific embodiment, there can be other variations, modifications, and alternatives. For example, the thickness of material can be a strained material according to a specific embodiment. That is, the strained material can be bi-axial or uni-axial according to a specific embodiment. Additionally, the strained material can be patterned and/or global according to a specific embodiment Depending upon the embodiment, the strained material can be formed using a patterned strain process using silicon germanium in etched regions of source/drain regions for MOS devices. In combination or alternatively, the strained material can be formed strained techniques described in "Method and System for Lattice Space Engineering," in the names of Francois J. Henley, et al. and listed as PCT Application No. PCT/US05/12410 filed Apr. 12, 2005 and "A Method for Fabricating Semiconductor Devices Using Strained Silicon Bearing Materials" in the name of Francois J. Henley and listed as PCT Application No. PCT/US04/38616 filed Nov. 18, 2004, each of which is commonly assigned, and hereby incorporated by reference. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A process for forming multi-layered substrates, the process comprising:
providing a first substrate, the first substrate comprising a thickness of material to be removed, the thickness of material to be removed comprising a first face region;
joining the first face region of the first substrate to a second face region of a second substrate to form an interface region between the first face region of the first substrate and the second face region of the second substrate;
removing the thickness of material from the first substrate while maintaining attachment of the first face region of the first substrate to the second face region of the second substrate;
forming a masking layer overlying a surface region of the thickness of material to form an exposed region of a portion of the thickness of material;
implanting particles into the exposed region and through a portion of the interface region to form a region of the particles within the vicinity of the portion of the interface region to couple the portion of the thickness of material to the second substrate to cause formation of an implanted region including at least the exposed region and the portion of the thickness of material; and
subjecting at least the implanted region to at least a thermal treatment process to cause crystallization of the implanted region.

2. The process of claim 1 wherein the particles comprise a conductive characteristic at the vicinity of the interface region.

3. The process of claim 1 wherein the particles comprise dopant particles.

4. The process of claim 3 wherein the dopant particles are selected from boron, arsenic, or phosphorus.

5. The process of claim 1 wherein the first substrate is a silicon wafer.

6. The process of claim 5 wherein the silicon wafer is characterized by a major crystallographic plane in the {100} plane.

7. The process of claim 5 wherein the silicon wafer is characterized by a major crystallographic plane in the {110} plane.

8. The process of claim 5 wherein the silicon wafer is characterized by a major crystallographic plane in the {111} plane.

9. The process of claim 1 wherein the region of the particles has a concentration of about $10^{18}$ atoms/cm$^3$ and greater.

10. The process of claim 1 wherein the joining comprises bonding the first face to the second face.

11. The process of claim 1 wherein the joining comprises plasma activated processing at least the first face or the second face.

12. The process of claim 1 wherein the joining comprises bonding the first face to the second face using an oxide material.

13. The process of claim 1 wherein the interface region is characterized by an insulating material.

14. The process of claim 1 wherein the region of particles changes the interface region from an insulating characteristic to a conductive characteristic.

15. The process of claim 1 wherein the implanting is provided using a high energy implanter.

16. The process of claim 1 wherein the interface region comprises a silicon dioxide material.

17. The process of claim 1 wherein the implanting forms a well region in the thickness of material and a portion of the second substrate.

18. The process of claim 1 further comprising forming a plurality of via structures through the interface region to electrically connect the thickness of material to a portion of the second substrate.

19. The process of claim 1 further comprising implanting second particles through the thickness of material to form a well region therein.

20. The process of claim 1 wherein the thickness of material is 8000 Angstroms and less.

21. The process of claim 1 wherein the first substrate comprises a silicon wafer, the silicon wafer is characterized by a first crystalline orientation, and the crystallized portion is characterized by a second crystalline orientation.

22. The process of claim 21 wherein the first crystalline orientation in a major crystallographic plane is the {110} plane, and the second crystalline orientation in a major crystallographic plane is the {100} plane.

23. The process of claim 1 wherein the implanting of the particles is through the portion of the thickness of material and a portion of the first face and a portion of the second face.

24. The process of claim 1 wherein the particles are characterized by a conductive property to provide electrical connection between the thickness of material and a portion of the second substrate.

25. The process of claim 1 wherein the particles comprises a plurality of silicon ions or a plurality of germanium ions.

26. The process of claim 1 wherein the crystallized portion is characterized by an orientation of a predetermined type, the predetermined type being of the second substrate.

* * * * *